United States Patent [19]

Baker

[11] 4,303,841
[45] Dec. 1, 1981

[54] VMOS/BIPOLAR POWER SWITCH

[75] Inventor: Richard H. Baker, Bedford, Mass.

[73] Assignee: Exxon Research & Engineering Co., Florham Park, N.J.

[21] Appl. No.: 41,008

[22] Filed: May 21, 1979

[51] Int. Cl.³ .................. H03K 17/04; H03K 17/284; H03K 17/56
[52] U.S. Cl. .................................. 307/570; 307/315; 357/23; 357/43; 357/46
[58] Field of Search .............. 307/251, 253, 254, 255, 307/315, 570; 357/23, 41, 43, 44, 46

[56] References Cited

U.S. PATENT DOCUMENTS

| | | | |
|---|---|---|---|
| 3,484,865 | 12/1969 | Nienhuis | 357/43 |
| 3,512,012 | 5/1970 | Kosowsky | 307/304 |
| 3,879,619 | 4/1975 | Pleshko | 307/251 |
| 3,896,367 | 7/1975 | Franz | 307/134 |
| 4,145,703 | 3/1979 | Blanchard | 357/23 |
| 4,176,401 | 11/1979 | Lonberger | 307/311 |

OTHER PUBLICATIONS

Barlage, *EDN*, Nov. 5, 1978, pp. 93-98.
Barlage, Fifth National Power Conversion Conf. (Powercon 5), Proc., pp. DZ-1 to DZ-8, May 1978.
Electronics, Oct. 13, 1969, pp. 207-208.
Siliconix Application Note AN-76-3, May 1976.

*Primary Examiner*—William D. Larkins

[57] ABSTRACT

A relatively high power switching device and circuit is provided via the combination discretely or on a common substrate of a VMOS transistor having a gate electrode for receiving a control signal, a drain electrode, and a source electrode, individually connected to the collector and base electrodes of a bipolar transistor, respectively, the collector-emitter current path of the latter being the main current carrying path of the switching device.

4 Claims, 12 Drawing Figures

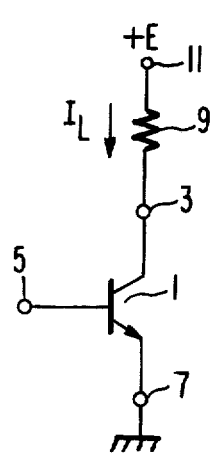
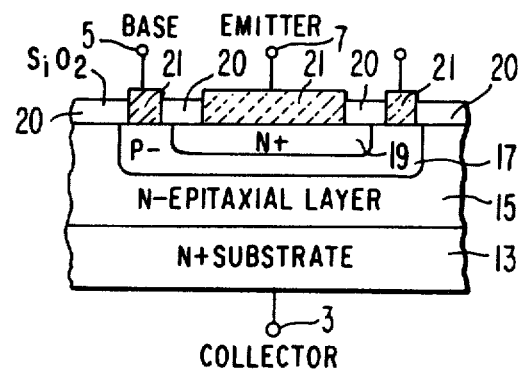
PRIOR ART
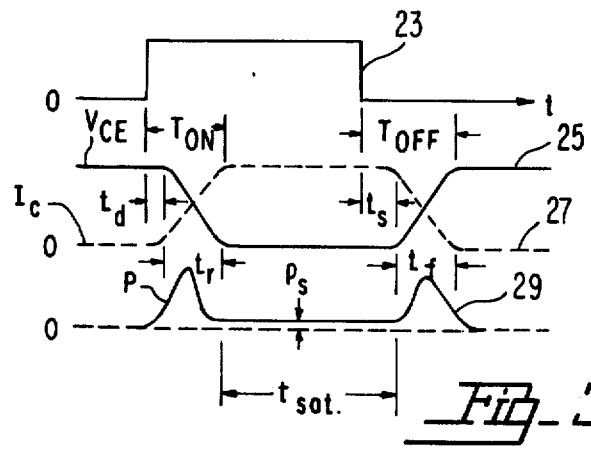
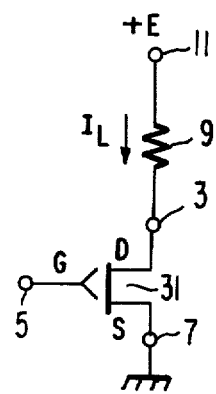
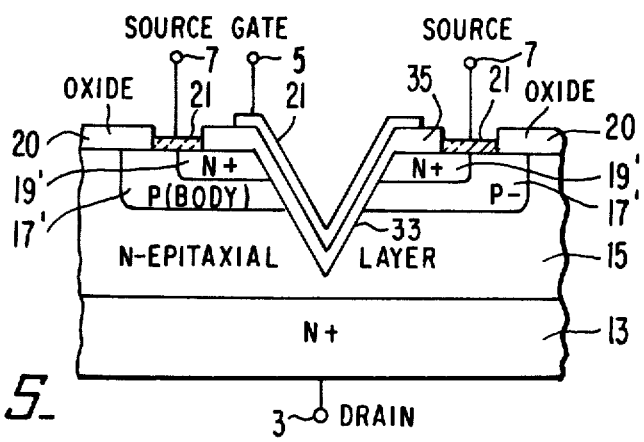

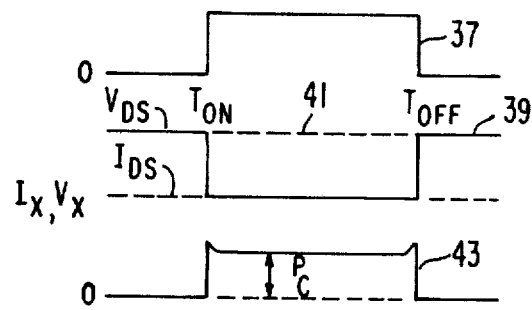
_Fig. 6._
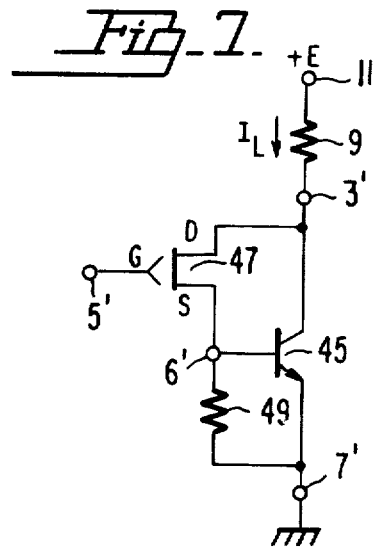
_Fig. 7._
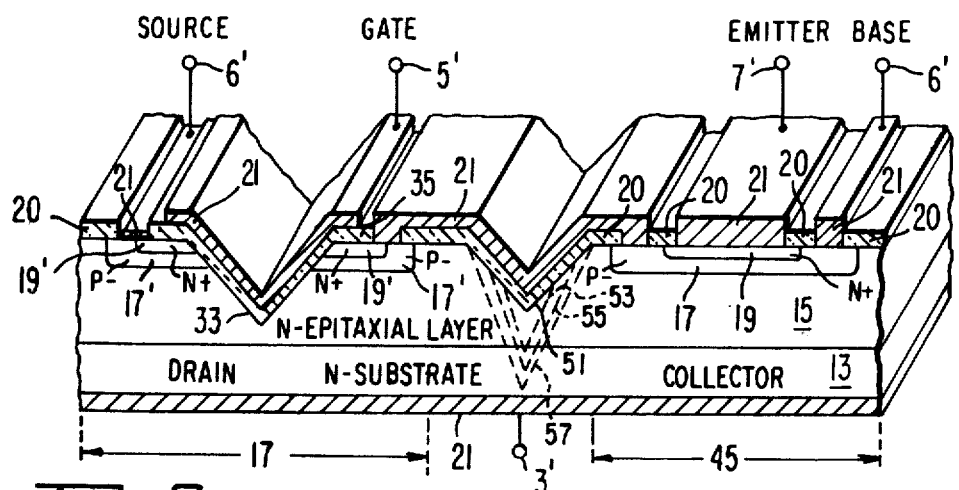
_Fig. 8._
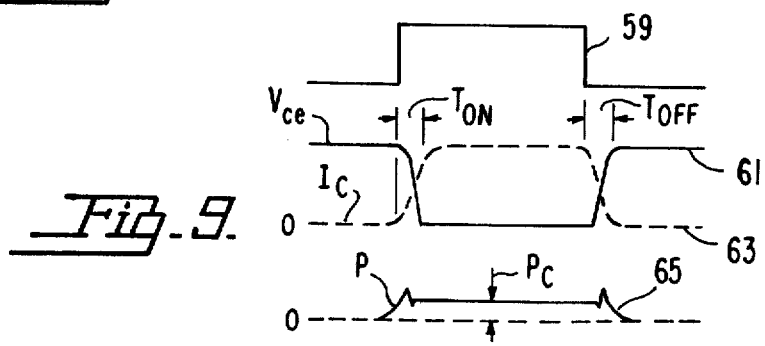
_Fig. 9._

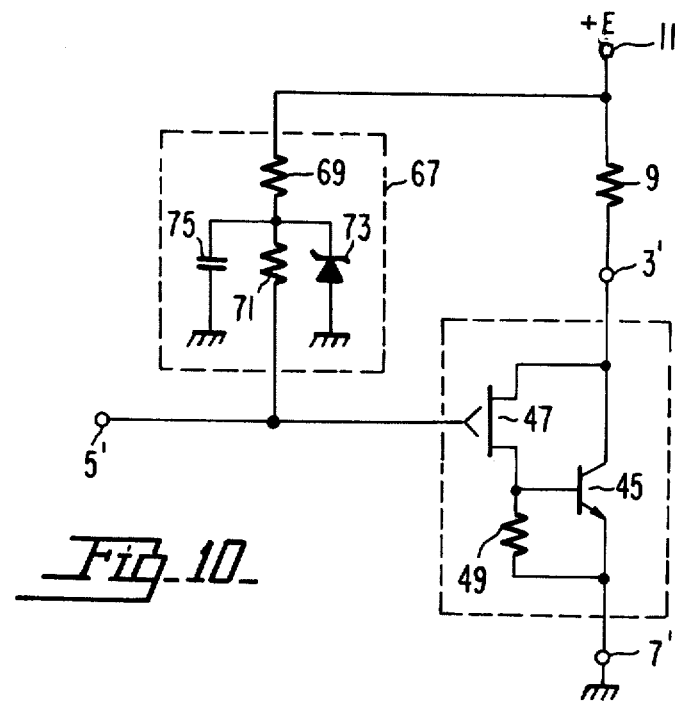
_Fig. 10_
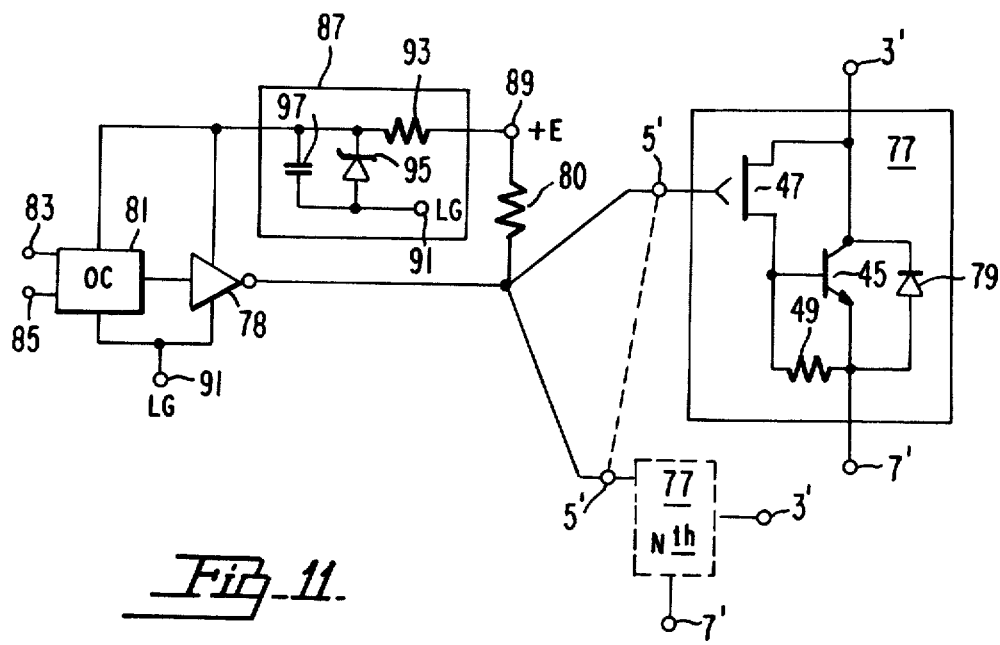
_Fig. 11_

1

VMOS/BIPOLAR POWER SWITCH

CROSS-REFERENCE TO RELATED APPLICATIONS

This invention is related to my inventions, Ser. No. 40,991, filed on May 21, 1979, for VMOS/BIPOLAR POWER SWITCHING DEVICE, and Ser. No. 40,269, filed on May 21, 1979 for VMOS/BIPOLAR DUAL-TRIGGERED SWITCH.

BACKGROUND OF THE INVENTION

The field of the present invention relates generally to power switching circuits and devices, and more specifically to such circuits and devices, including the combination of bipolar and field effect transistors.

It is known in the prior art to apply metal oxide semiconductors (MOS devices) for use in low power digital circuits, and to apply power bipolar transistors, bipolar Darlington circuits, and silicon-controlled-rectifiers (hereinafter referred to as SCRs) high-power applications. Bipolar transistors operated near their rated current and voltage are susceptible to damage from current transients, and have a positive temperature coefficient of current, which may lead to "thermal runaway" when such devices are connected in parallel, as certain areas of the bipolar transistor's substrate heat up under severe operating conditions, causing damage or destruction of the transistor(s). Bipolar power switching transistors typically have DC input impedances ranging from 1.0 to 10.0 ohms, and DC current gains from 10 to 50. Darlington circuits typically have a high saturation voltage across their main current carrying path, resulting in a relatively high static power dissipation. SCRs are widely applied for use in power circuits, but have the disadvantage that once they are turned on via a signal applied to their gate electrode, they cannot be turned off by applying another signal to, or removing the original signal from, their gate electrode. SCRs are turned off by either substantially reducing toward zero magnitude the current flowing through their main current path, or by reducing to zero value the voltage across their anode and cathode electrodes. Accordingly, in many applications where the voltage across an SCR's anode and cathode electrodes does not "naturally" reduce to zero, complicated circuitry is required to turn off the SCR. Accordingly, from the above discussion it is apparent that a present problem in the current state of the art in power switching technology, is to provide a relatively high power switching device or circuit that has (1) relatively high switching speeds, (2) relatively low static power dissipation, (3) immunity to thermal runaway, (4) good transient current capability, and (5) can be turned on or off via the application of low power signal to its control electrode.

SUMMARY OF THE INVENTION

The present invention relates to the discovery that a bipolar transistor can be controlled by a VMOS transistor to provide high speed switching at relatively high power levels, with low power dissipation, immunity from thermal runaway when such devices are connected in parallel, and substantially increased resistance to damage from current transients. The present inventor discovered that by connecting the drain and source electrodes of a VMOS transistor to the collector and base electrodes of a bipolar power transistor, respectively, that a relatively high power switching device and circuit are obtained having operating advantages that neither of the devices alone can provide. The inventor further discovered that because the manufacturing processes for a bipolar transistor and a VMOS transistor are substantially the same except for the etching of the V-groove and the subsequent gate oxidation of the VMOS transistor, that each can be fabricated on a common substrate in juxtaposition, for producing a new device on a single integrated circuit chip.

BRIEF DESCRIPTION OF THE DRAWINGS

In the drawing, wherein like elements are indicated by the same reference designation:

FIG. 1 shows a circuit schematic diagram of a prior art switching circuit using a bipolar transistor;

FIG. 2 shows a cross-section of the bipolar transistor of FIG. 1;

FIG. 3 shows curves relating to the switching characteristics of the bipolar transistor circuit of FIG. 1;

FIG. 4 shows a circuit schematic diagram of a prior art switching circuit using a VMOS transistor;

FIG. 5 shows a cross-section of the VMOS transistor of FIG. 4;

FIG. 6 shows curves relating to the switching characteristics of the VMOS transistor circuit of FIG. 4;

FIG. 7 shows a circuit schematic diagram of a first embodiment of the invention;

FIG. 8 shows a cross-section of the switching device of the present invention;

FIG. 9 shows curves relating to the switching characteristics of the switching device of the present invention;

FIG. 10 shows a circuit schematic diagram of another embodiment of the present invention;

and FIGS. 11 and 12 show circuit schematic diagrams of yet other embodiments of the invention, respectively.

DETAILED DESCRIPTION OF THE PREFERRED EMBODIMENTS

Figure 12:
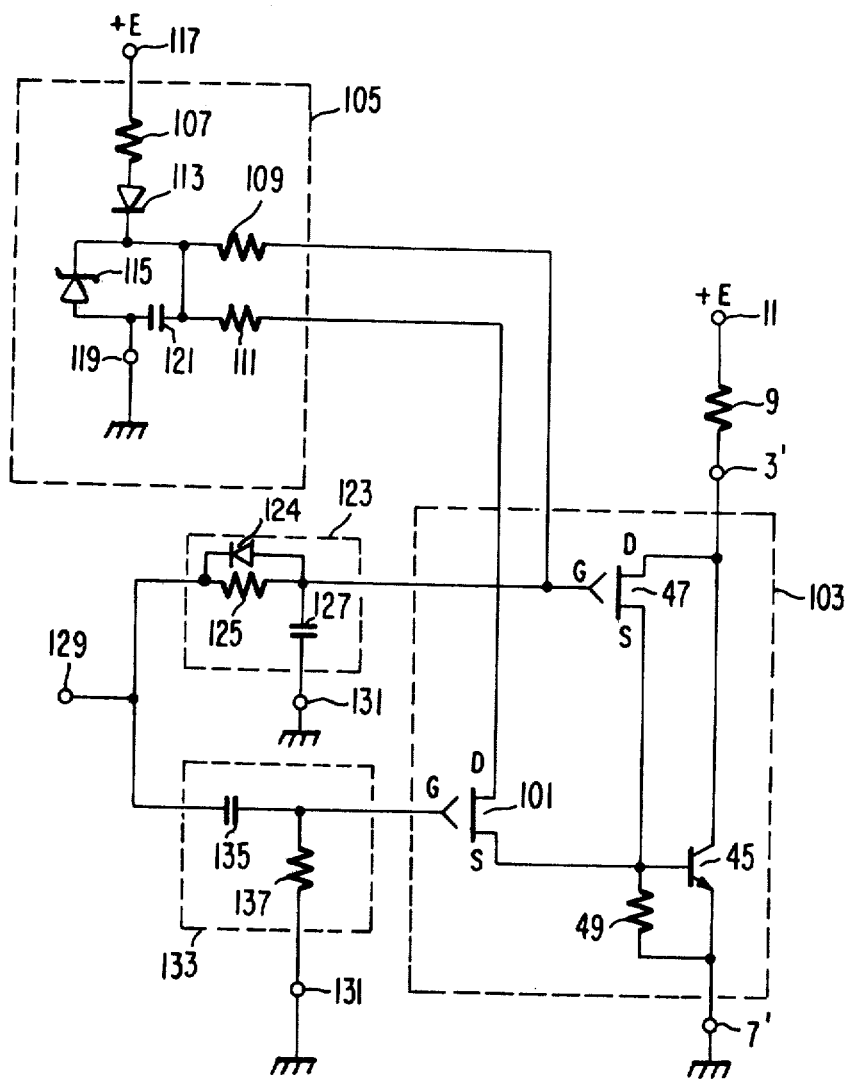

In FIG. 1, a bipolar power switching transistor 1 has a collector electrode connected to an operating voltage terminal 3, a base electrode connected to an input terminal 5 for receiving a control signal, and an emitter electrode connected to a reference terminal 7 for connection to a point of reference potential. A load resistor 9 is connected between a power terminal 11 and the operating voltage terminal 3. An operating voltage $+E$ volts is applied to the power terminal 11. Assuming that the bipolar transistor 1 is a double-diffused epitaxial plana transistor, its cross-section for the doping profile is typically as shown in FIG. 2. The manufacturing process for producing the NPN transistor 1 of FIGS. 1 and 2 is well known. As shown, the bipolar transistor 1 has a collector region 13 formed by $N^+$ (the + refers to a relatively high density of the related majority carriers) material which is part of the original substrate. Above the region 13, an epitaxial layer 15 of $N^-$ (the − refers to a relatively low density of the related majority carriers) material is grown on the substrate to form the collector region of the transistor. The base region 17 and emitter region 19 are formed by diffusing $P^-$ and $N^+$ material, into the epitaxial layer 15 as shown. To permit wires to be connected to the various regions, a metal deposition process is used to deposit a metal such as aluminum in the metallization areas 21, as shown. An electrically insulative thin film coating 20, such as silicon dioxide ($SiO_2$), for example, is deposited between the metallization areas 21.

As known in transistor physics, in a bipolar transistor there are interelectrode capacitors typically existing between the base and the emitter, and the base and collector electrodes that must be charged and discharged in turning on and turning off, respectively, the transistor. For example, the curves in FIG. 3 are typical of the response of the bipolar transistor switching circuit of FIG. 1 to a current pulse control signal 23 applied to the control terminal 5. For example, in FIG. 3 an input pulse waveform 23 is shown, which is assumed to have a high enough positive current level to drive the bipolar transistor 1 into saturation. If the amplitude of this pulse waveform 23 is too high, excessive base current will flow into the transistor 1, causing damage or destruction to the transistor, assuming that the pulse time is of sufficient duration to permit such damage to occur. Curves 25, 27 and 29, represent the voltage across the collector and emitter electrodes ($V_{ce}$), the collector current ($I_c$), and the power (P) dissipated by the transistor, respectively. As shown, at the leading edge of the pulse 23, the transistor 1 begins to turn on and completes its turn on in a time period $T_{ON}$. This turn on time $T_{ON}$ includes an initial delay time $t_d$, related to carrier mobility, and a rise time $t_r$, representing the time for the collector current $I_c$ to rise from 10% of its final value to 90% of its final value. The rise time $t_r$ associated with the falling edge of $V_{ce}$ is related to the charging of the interelectrode capacitances. Typically, the turn on time $T_{ON}$ for a power transistor is about 2 microseconds. Just after the occurrence of the trailing edge of the input pulse 23, the transistor 1 turns off in a time period $T_{OFF}$. The turn off time $T_{OFF}$ includes a storage time $t_s$ related to the decay of stored minority carriers in the silicon material of the base region (clearing out the charges), and a fall time $t_f$ represented by the time it takes the collector current $I_c$ to fall from 90% of its maximum value to 10% of its maximum value. The fall time $t_f$ results from a complex physical relation involving mobility, doping profiles, area of the device, and load impedance. In driving the transistor 1 into saturation, its greatest power dissipation occurs during the rise time and fall time periods, as shown by curves 27 and 29. The turn off time $T_{OFF}$ is usually longer than the turn on time $T_{ON}$, but both are also functions of the output load and of how the transistor is driven (pulsed). As transistor 1 turns on, its $V_{ce}$ decreases to some minimum value at saturation of the transistor, and its collector current $I_c$ rises to some maximum value set by the magnitude of the supply voltage and the value of the collector load resistor. Typically, as shown in the power curve 29, during the saturation time $t_{sat}$ of transistor 1, the power dissipated during this $P_s$ is approximately equal to the product of the voltage ($V_{ce}$) across the collector and emitter electrodes being at about 1 volt and the value of the current $I_L$ flowing through the load 9:

$$P_s = V_{ce}(I_L) \qquad (1)$$

Recently, a vertical metal oxide semiconductor (hereinafter referred to as VMOS) field effect transistor has been invented. The VMOS device has a very high static input impedance, and consequently requires extremely low drive power, making it a voltage operated device with high power gain. VMOS devices provide very fast switching times, permit direct paralleling of devices without complicated biasing networks for switching high current levels, and have a negative temperature coefficient for current (a positive temperature coefficient for resistance), thereby providing negative feedback internal to the device which substantially eliminates the destructive thermal runaway problem of bipolar transistors when connected in parallel with one another. In the present state of the art, VMOS devices are available for handling voltages up to 400 volts at about 8 amperes of current. Unfortunately, the present high power VMOS devices have a relatively high on-resistance of about 1 ohm between their source and drain electrodes when conducting. This resistance causes relatively high power dissipation at high power levels. For example, assuming that 100 ampere VMOS devices will become available in the near future, but with little improvement in the series on resistance of the device, about 10,000 watts will be dissipated at this magnitude of current. In comparison, bipolar power transistors typically have a resistance of less that 20 milliohms between their collector and emitter electrodes when conducting in a saturated state, but have the disadvantage of a relatively low value of input resistance, relatively low switching speed in comparison to a VMOS transistor, and other problems as previously mentioned.

Note that the symbol shown for the VMOS device 31 in FIG. 4 has been devised by the present inventor in recognition that a standardized symbol for the VMOS device has not been accepted. In FIG. 4, a VMOS (vertical metal oxide semiconductor) device 31 is schematically illustrated for the bipolar transistor 1 of FIG. 1. The VMOS transistor 31 is connected with its drain electrode (marked D) to the operating voltage terminal 3, source electrode (marked S) to the reference voltage terminal 7, and gate electrode (marked G) to the input or control terminal 5. A VMOS device has a static DC input impedance at its gate of about $10^6$ times greater than a bipolar transistor, a power gain (depending upon the circuit components used) typically 1000 times greater, with no susceptibility to thermal runaway or secondary breakdown, and turn on $T_{ON}$ and turn off $T_{OFF}$ times (depending on other circuit elements) of about 50 nanoseconds. A VMOS transistor is substantially a voltage operated device, whereas a bipolar transistor is a current operated device. Typically, less than 100 nanoamperes of static drive current are required for driving a VMOS device, since the DC power gain of such a switch is so high. Accordingly, VMOS devices can be operated in relatively high power ranges, but driven directly from low drive power devices such as CMOS logic or optical isolators. A VMOS device does not have a minority carrier storage time, because it is a majority carrier device, the charge carriers being controlled by electric fields rather than the physical injection and extraction of minority carriers in an active region. However, parasitic elements such as series gate inductances and shunt capacitance cause very small switching delay times, typically several nanoseconds. As previously mentioned, bipolar transistors have a positive temperature coefficient to current or a negative temperature coefficient for resistance in their main current carrying path, which may lead to a positive feedback or thermal runaway situation when such transistors are connected in parallel. In other words, as the VMOS chip heats up, it will tend to draw less current. Accordingly, VMOS devices can be connected in direct parallel without requiring special biasing circuits to establish that they share the total load current equally.

This parallel operation permits switching of current having magnitudes equivalent to the combined rating of the VMOS units that are connected in parallel.

To increase the voltage breakdown capability of VMOS switching circuits, a plurality of VMOS devices can be connected with their source-drain paths in series, and their gate electrodes individually biased. This provides a voltage breakdown characteristic approximately equal to the sum of the voltage breakdown characteristics of the individual VMOS devices.

In FIG. 5, a cross-section of a typical VMOS structure is shown. In comparison to the cross-section of the NPN bipolar transistor of FIG. 2, the basic cross-sections are substantially identical except in the area where the V-groove 33 is etched. The manufacturing process for a VMOS transistor is essentially identical to that for a bipolar transistor, except that VMOS device processing requires the extra steps of etching the V-groove 33 and the subsequent gate oxidation 35. Diffusion regions of 17', 19', of P− and N+ material, respectively, are on to the side of the V-groove 33, as shown. Also, the doping profiles for the different areas of the VMOS transistor may differ from the like areas of the bipolar transistor. Metallization 21 (electrodes) is deposited as shown for providing electrical connection to the gate and source regions. Other areas are covered with an oxide layer 20, as shown.

When a pulse waveform or control signal 37, as shown in FIG. 6, is applied to the control terminal 5 or gate electrode of the VMOS transistor 31, the transistor turns on typically in about 0.05 microseconds after the onset of the leading edge of the pulse 37, and turn off in about the same time after the onset of the trailing edge of the pulse 37. When the VMOS 31 turns on, its drain to source voltage $V_{DS}$ reduces to some very low level of voltage $V_x$, as shown by waveform 39, and the current $I_{DS}$ flowing through the drain to source path increases in magnitude from some very low level $I_x$ (less than 1 microampere of leakage current) to some substantially higher level as shown by curve 41. The magnitude of the source-drain current can be controlled by adjusting the upper level of the voltage of the gate pulse 37 within a range from cut-off to fully on. Note that the level of conduction of the bipolar transistor 1 can also be controlled by adjusting the magnitude of the base current. When turned on with maximum gate voltage into saturation, presently available high power VMOS switches have an on resistance between the drain and source electrodes of about 0.2 to 1.0 ohm. Consequently, as shown in the power waveform 43, the power dissipated by a VMOS during the on state is equal to the square of the load current $(I_L)^2$ times the saturation resistance $r_s$:

$$P_c = r_s(I_L)^2 \qquad (2)$$

Accordingly, assuming a load current of 40 amperes, the VMOS transistor 31 dissipates between 320 watts and 1600 watts, depending on the value of $r_s$, when the VMOS is on. Herein lies the main disadvantage of present state of the technology for VMOS power devices, their on resistance is high in comparison to a bipolar transistor. Accordingly, VMOS devices, at their present state of development, are not as efficient as bipolar transistors for high power switching applications.

Note that the symbol shown for the VMOS device 31 in FIG. 4 has been devised by the present inventor in recognition that a standardized symbol for the VMOS device has not been accepted.

The present inventor discovered that the circuit of FIG. 7 provides a relatively high-power, high-speed solid state switching device which overcomes the substantial disadvantages of SCRs, bipolar transistors, Darlington circuits, and VMOS devices. As shown, in this first embodiment of the invention which includes an NPN bipolar power switching transistor 45 connected with its collector electrode to the operating voltage terminal 3', and emitter electrode to the reference terminal 7'. A VMOS device 47 is connected with its drain and source electrodes to the collector 3' and base 6' electrodes, respectively, of transistor 45, and its gate electrode to the input or control terminal 5'. A resistor 49 having a low value of resistance is connected between the base and emitter electrodes of the bipolar transistor 45, for insuring that the transistor 45 is held off when zero bias is applied to the gate electrode 5', and for providing a discharge path for charge stored in the base during the conduction period of transistor 45. A typical value for this resistor is 1 (one) ohm. The resistor 49 can be included internally or externally to this new combination 45,47, aptly named a CSD (Combination Semiconductor Device) by the inventor. The present switching device 45,47 has the high-power switching advantages of an SCR (silicon-controlled-rectifier) and the additional advantage of providing for turn off by application of an appropriate signal at the gate of the VMOS 47.

A cross-section of this switching device 45,47 is shown in FIG. 8. As shown, and as previously explained, since VMOS devices and bipolar transistors are manufactured using substantially the same processes, the bipolar transistor 45 and VMOS device 47 can be fabricated on the same substrate. As shown, these devices 45,47 are juxtapositioned with an isolation groove 51 being etched therebetween into at least a substantial portion of the epitaxial layer 15. Silicon dioxide layers 20 are deposited over this isolation groove 51 and other areas of the devices 45,47 as shown. The oxide layer of the isolation groove 51 is then overlaid with metallization 21 for electrically connecting the base region 17 of the NPN power transistor 45 with the source region 17',19' of the VMOS 47. Other areas of metallization 21 (electrodes) are overlaid as shown for electrically connecting the drain and collector regions to operating voltage terminal 3', emitter region to terminal 7', and gate to terminal 5'. The phantom lines 53,55,57 correspond to deeper etching of the isolation groove 51 for obtaining even greater electrical isolation between the VMOS transistor 47 and bipolar transistor 45, if necessary for given applications. Note that a plurality of such devices 45,47 can be deposited on the same substrate. Assuming that the plurality of such devices 45,47 are identical in electrical characteristics and equal in number to N, N being some integer number greater than 1, if the devices are connected in direct parallel, then the current carrying capability of the parallel connected devices will be equal to about N times the current carrying capability of an individual one of these devices. Alternatively, if a plurality N of these devices 45,47 are connected in series with respect to their main current carrying paths (the collector-emitter electrode current carrying path of the bipolar transistor 45), and the gate electrodes of each one of the VMOS transistors 47 each driven by a sufficient level of voltage for turning on the associated VMOS 47, then the voltage breakdown capability of these series connected devices 45, 47 will be about N times the voltage breakdown capability of an individual one of these devices 45,47. In other words, in the series connection, individual floating bias voltage is applied to the gate electrodes of the VMOS transistors 47, with each bias voltage being referenced to voltage at the emitter electrode of the associated bipolar transistor 45. In operation of the device 45,47, if a pulse control signal 57 (see FIG. 9) is applied to the control terminal 5 or gate electrode of the VMOS 47, assuming that the level of voltage of the pulse 59 is high enough to fully turn on the VMOS device 47 into saturation, the VMOS 47 will turn on to provide approximately a 1 ohm current conduction path (its drain-source electrode current path) between the collector and base electrodes of bipolar transistor 45. At this time, because the VMOS 47 turns on much faster than does the bipolar transistor 45, almost all of the load current $I_L$ is driven into the base electrode of bipolar transistor 45, overdriving the bipolar transistor 45, which greatly speeds up its transition to the high conduction state. This overdrive condition will occur for only a short period of time, for as shown in FIG. 9, the voltage across the collector and emitter electrodes of the transistor 45 rapidly decreases as it turns on (see waveform 61), causing the base current supplied via the VMOS 47 to rapidly decrease, removing the overdrive condition. The VMOS device 47 provides negative feedback between the collector and base electrodes of bipolar transistor 45 and accordingly adjusts the level of voltage between the collector and base electrodes of the bipolar transistor to maintain the latter in a state of conduction. Because of the feedback, the bipolar transistor conducts near the edge of saturation but does not actually go into saturation. (As is well known in the art, a bipolar transistor becomes saturated when both the collector-base and emitter-base P-N junctions are forward biased. Upon the occurrence of this condition, an increase in its base drive current will not substantially increase the collector current of the bipolar transistor.) In this manner because of the very short period of overdrive caused by the feedback, the bipolar transistor 45 is turned on in about 0.5 microseconds. Therefore, the present device including bipolar transistor 45 and VMOS device 47 has a turn on time which is at least four times shorter than can be obtained with known bipolar switching devices operated in a circuit of FIG. 1. Note that as transistor 45 turns on, its collector current $I_c$ (see waveform 63) rapidly increases from a relatively low value (leakage current) to a substantially high value at equilibrium operation of the device 45,47. The voltage level of the control pulse 59 can be adjusted to different levels for controlling the level of conduction of the bipolar transistor 45 in a range between cutoff and the edge of saturation, for certain applications. In typical switching applications, the level of pulse 59 is made high enough to cause the bipolar transistor 45 to operate at the edge of saturation. If some transient demand occurs, causing the load current $I_L$ to suddenly increase, whereby bipolar transistor 45 is pulled further out of saturation, causing the voltage across its collector-emitter electrodes to suddenly increase, because of the negative feedback, transistor 47 responds, driving more base current into the base electrode of transistor 45, causing bipolar transistor 45 to conduct harder and consequently move back towards the edge of saturation. The increased conduction forces the voltage across the collector-emitter electrodes to decrease. In this manner, the negative feedback action provided by the VMOS device 47 improves the transient capability of the bipolar transistor 45 by a factor of at least 4 times its normally rated transient current capability. Accordingly, the present switching device 45,47 can be used to drive inductive loads, such as the windings of an electric motor. Also, because of the positive temperature coefficient for resistance between its drain and source electrodes, the VMOS transistor 47 automatically prevents the bipolar transistor 45 from ever going into thermal runaway, when such combinational devices 45,47 are connected on parallel.

Assuming, conservatively, that the load current is about 44 amperes in magnitude and that the DC current gain $\beta$ of bipolar transistor 45 is about 10, then at equilibrium of the device 45,47, about 4 amperes of current will flow through VMOS 47 (its "on" resistance $r_s$ being about 1 ohm) into the base electrode of the bipolar transistor 45, causing the latter to conduct about 40 amperes of current $I_c$ through its collector-emitter current path, with a voltage $V_{ce}$ thereacross of about 5 volts, a voltage $V_{be}$ across its base-emitter electrodes of about 1.0 volt, and a load current $I_L$ of 44 amperes. Under the equilibrium conditions cited and assuming that the bipolar transistor 45 is operating at the edge of saturation, the power being dissipated by the device (see FIG. 9) $P_c$ is about 218 watts as derived from the following equation:

$$P_c = I_c V_{ce} + \left(\frac{I_c}{B}\right)^2 r_s + \left(\frac{I_c}{B}\right) V_{be} \qquad (3)$$

This compares, for switching the same level of load current (44 amperes) to a power level of 1936 watts dissipation (see FIG. 6) in the circuit of FIG. 4 using only a VMOS device 31, and with 44 watts (see FIG. 3) in the circuit of FIG. 1 using only a bipolar transistor 1. However, since the bipolar transistor 45 is allowed to only operate to the edge of saturation, the charge storage time $t_s$ of the combination semiconductor device 45,47 of FIG. 9 is equal to substantially zero, whereas when the bipolar transistor 1 is driven into saturation, it has a storage time of several microseconds. In response to the trailing edge of the control pulse 59, the VMOS transistor 47 typically turns off in 0.05 microseconds, and the bipolar transistor about 0.45 microseconds later. Accordingly, the turn off time for the combination semiconductor device 45,47 is about 0.5 microseconds. This is compared to a turn off time from saturation as high as 3.7 microseconds for the transistor 45 alone.

Verification of the above was confirmed in laboratory tests, the circuit of FIG. 7 being constructed using a VN23IA VMOS transistor (manufactured by Siliconix Incorporated, Santa Clara, California, U.S.A.) for transistor 47; a 20 ohm resistor for loan 9; a 2 ohm resistor for resistor 49; and an MJE13009 bipolar transistor (manufactured by Motorola Semiconductor Products Inc., Phoenix, Arizona 85036) for transistor 45. The manufacturer's specification for the VN23IA VMOS transistor is as follows:

$V_{DS\ max.}$ (maximum drain-to-source voltage)=200 volts $I_{DS\ max.}$ (maximum drain-to-source current)=8 amperes $T_{ON}$ (turn on time via +5 volt pulse at gate)=0.05 microseconds $T_{OFF}$ (turn off time)

$\Gamma ds$ (resistance between drain and source electrodes when turned on)=0.3 ohms The manufacturer's specification for the MJE13009 bipolar transistor is as follows:

$V_{CE\ max.}$ (maximum collector-emitter voltage) = 400 volts $I_{CM}$ (maximum collector current in pulsed mode) = 24 amperes $I_C$ (maximum allowable continuous collector current) = 12 amperes DC $T_{ON}$ (turn on time for resistively switching 125 volts, at $I_c = 5$ amperes) = 0.41 microseconds $T_{OFF}$ (turn off time from operating with resistive load, 125 volts operating voltage, with $I_c = 5$ amperes) = 1.65 microseconds With +E equal to 100 volts and a pulse having an amplitude of +5 volts applied to the gate electrode G of VMOS transistor 47, the bipolar transistor 45 was turned on in 0.1 microseconds. When the +5 volt pulse was removed, reducing the voltage at the gate to zero in step-like fashion, the bipolar transistor 45 turned off in 0.4 microseconds.

The transient response for the same MJE13009 bipolar transistor as used above was tested in the circuit of FIG. 7 by using the same components as shown above, except that the 20 ohm resistive load was replaced with three 100 watt incandescent lamps connected in parallel, and the operating voltage was changed from 100 volts to 150 volts. The cold resistance of each incandescent lamp is about 3 ohms, therefore, the incandescent lamp load 9 provided about a 1.0 ohm load when the lamps are cold. At the initiation of turn on of the bipolar transistor 45 (via application of a voltage pulse to the gate of VMOS transistor 47, as above), a transient current having a magnitude of about 100 amperes was measured, with no failure of the bipolar transistor 45. This transient test was repeated numerous times with the same result. Accordingly, in the circuit of FIG. 7, the transient capability of the MJE13009 bipolar transistor 45 is at least 4 times its rated magnitude of 24 amperes.

In summation, the present device 45,47 has a switching speed which is several times faster (at least 4 times faster) than a bipolar power transistor, has a transient capability that is about 4 times greater than a bipolar transistor, is immune from thermal runaway when connected in parallel with other such devices 45,47, and has a power dissipation when in full conduction that is about 8 times less than that of a power VMOS device conducting the same magnitude of current. The device 45,47 also provides a DC input impedance exceeding $10^{12}$ ohms, and a DC current gain exceeding $10^6$.

In FIG. 10, a bias voltage supply 67 is included in a power switching circuit 45,47 for insuring that the device 45,47 can be rapidly turned on directly from very low power logic circuits. The bias supply 67 only requires low cost components because of the very low drive power required by the VMOS transistor 47. The bias supply 67 includes a pair of resistors 69,71, a zener diode 73, and a capacitor 75 for filtering. In this circuit, whenever the output from a logic circuit connected to control terminal 5 goes "high" or to a positive logic level, the bias voltage supply 67 will respond by substantially supplying the drive current of about 100 nanoamps to the gate of VMOS transistor 47 via resistor 71, for turning on the combinational device 45,47.

In FIG. 11, another embodiment of the invention includes a plurality of N (N being an integer number 2,3 . . . ) switches 77 (devices 45,47) having their individual input or control terminals 5 connected in common to the output of an inverter buffer driver 78. These N switches 77 can be provided on a common substrate. A diode 79 is shown connected in anti-parallel with the bipolar transistor 45 of each switch 77. This diode 79 permits bilateral switching action of the switches 77, when driving complex impedances such as inductive loads. The diodes 79 can be integrated on the same substrate with the N switches 77. An optical coupler 81 provides electrical isolation between a source of input signals connected between input terminals 83 and 85 of the optical coupler 81. In this manner, the signal ground and power switching circuit ground are isolated from one another, substantially eliminating power transients from causing false triggering of the switching circuit. A floating bias voltage supply 87 is connected between a power terminal 89 and a local ground (LG) terminal 91 for the power switching side of the circuit. The bias supply 87 includes a resistor 93, a zener diode 95, and a filter capacitor 97. As shown, the bias supply 87 provides power for both the optical coupler 81 and buffer driver 78. A pull-up resistor 80 is connected between terminal 89 and the output of driver 78. As previously described, the switches 77 can be connected in direct parallel for switching currents having magnitudes equal to about N times the current switching rating of an individual switch 77. Also, the switches 77 can be connected with their main current paths in series for increasing the voltage breakdown relative to a single switch 77 by a factor of about N. However, when the switches 77 are series connected, the gates of the respective VMOS transistors 47 are typically not connected in common, each gate being driven by an individual floating supply 87 and optical coupler circuit 81,78, the local grounds (LG) being referenced to the voltage at terminal 7' of their respective switch 77. It is assumed for purposes of this illustration that each one of the switches 77 are identical in electrical characteristics, but this may not necessarily be true in practice. For a given switch 77, the current carrying capacity of VMOS device 47 can be provided by connecting a plurality of VMOS devices in parallel to provide the function of VMOS device 47 with a current carrying capability substantially equal to some of the current ratings of the plurality of VMOS devices. Similarly, a plurality of NPN bipolar transistors can be connected on parallel, to provide the function of bipolar transistor 45 with a current rating equal substantially to the sum of current ratings of the individual bipolar transistors.

As described above, the present switching device includes the combination of a VMOS device 47 connected with its main current path between the collector and emitter electrodes of a bipolar transistor 45. A small value resistor 49 is connected between the base and emitter electrodes of the bipolar transistor 45 for providing a discharge path charge stored in the base of transistor 45, and for holding this transistor off during zero bias conditions. This device 45,47 can be fully integrated on a single substrate. In providing positive feedback between the collector and emitter electrodes of the bipolar transistor 45, the VMOS transistor 47 increases the transient capability of the bipolar transistor 45 by a factor from 4 to 10 times. The transient capability of the bipolar transistor 45 is increased because whenever a transient voltage causes the voltage between its collector and emitter electrodes ($V_{ce}$) to increase causing the transistor 45 to move its conduction further away from saturation, VMOS transistor 47 acts to feedback more current from the collector to the base electrode of transistor 45, forcing the latter to conduct "harder" and move back towards saturation, thereby reducing the $V_{ce}$ and hence excess power dissipation caused by the transient condition. Upon initial turn on of the device 45,47, the high base current available from the VMOS transistor 47 initially permits overdriving of the bipolar transistor 45, further permitting a lower $\beta$ or DC current gain bipolar power transistor 45 to be used; the lower $\beta$ transistor 45 enhances the switching speed of the combination 45,47. Additionally, the combinational device 45,47 when connected on parallel with other like devices cannot go into thermal runaway, has a higher switching speed than a power bipolar transistor alone, and dissipates substantially less power than a power VMOS transistor alone. Also, the present switch 45,47 is capable of being fabricated on a single substrate, and of switching at least 5 amperes of current at voltage levels exceeding 50 volts. However, because of the high dissipation during conduction of currently available VMOS transistors, it is not at this time practical to use the present switch 45,47 at power levels exceeding 2 kilowatts (advances in VMOS technology will surely increase the useful power level of VMOS transistors).

VMOS devices, as previously described, have much faster switching speeds than bipolar transistors. In certain applications, this switching speed differential may cause transient problems in turning on the circuit of FIG. 7. For example, when a control signal of positive polarity and sufficient amplitude is applied to the gate or control terminal 5', VMOS transistor 47 quickly turns on, and for a transient period of time carries substantially the entire load current via its drain-source, current path, until bipolar transistor 45 begins to turn on and lower the voltage level between its collector and base electrodes. If the initial transient current is of sufficient magnitude and duration, excess power dissipation may occur in VMOS transistor 47, damaging the device, as it supplies base current to bipolar transistor 45. Also, the large current surge may damage the bipolar transistor 45. As is known to one skilled in the art, one method to limit the magnitude of this transient current is to use snubber circuit techniques which are operative during the transient period. One way is to provide reactive impedance in series with the current path of the device to be protected.

In FIG. 12, a circuit schematic diagram of another embodiment of the invention, shows a switching circuit of the present invention that does not require "snubbing circuitry" to avoid the turn on transient problems discussed previously. As shown, a second VMOS device 101 is added to the basic inventive switching circuit 45,47. Although shown as a VMOS, transistor 101 can also be a low power bipolar transistor, because a high speed, low power, low voltage switching transistor will provide the function of transistor 101, as will be described below. This additional transistor 101 could be included discretely or included on the same integrated circuit chip 103 with the CSD 45,47, and resistor 49. The entire circuit of FIG. 12 can also be constructed only from discrete components. A bias supply 105, comprising three resistors 107, 109, 111, a diode 113, a zener diode 115, an operating voltage terminal 117 for receiving an operating voltage $+E$, a reference terminal 119 for connection to a point of reference potential, and filter capacitor 121, provides bias voltages to the gate and drain electrodes of VMOS transistors 47 and 101, respectively. An integrating network 123 including a resistor 125, and capacitor 127, is connected between input or control terminal 129 and a reference terminal 131. A differentiating network, including capacitor 135, and resistor 137, is connected between control terminal 129 and a reference terminal 131.

In operation of the circuit of FIG. 12, a positive going control signal or voltage step is applied to control terminal 129. The differentiating network 133 responds to this signal by developing (within a substantially short time) at the common connection of capacitor 135 and resistor 137 a positive going voltage pulse, which is applied to the gate of VMOS 101. In response to this positive pulse, VMOS 101 turns on with a transient overdrive, lowering the impedance between its drain-source electrodes to conduct current via its drain-source current path from resistor 111 of bias supply 105, to the base electrode of NPN transistor 45. Transistor 45 responds to this base current by beginning to turn on and lower the impedance between its collector-emitter electrodes, thereby decreasing the voltage at its collector electrode. The values of the components of differentiating network 133 and integrating network 123 are chosen so that just after transistor 45 has substantially turned on, integrating network 123 times out to develop a voltage across capacitor 127 of sufficient positive amplitude to permit VMOS 47 to complete the turn on of transistor 45, and to maintain it in a high state of conduction. Accordingly, VMOS transistor 47 so turns with substantially reduced transient dissipation, because of the prior initiation of turn on of transistor 45 via VMOS 101 and differentiating network 133, as previously described. Just after VMOS transistor 47 turns on, capacitor 135 of differentiating network 133 becomes substantially charged, causing the voltage at the gate electrode of VMOS transistor 101 to approach the reference potential at terminal 131 via resistor 137, turning off this transistor 101. Thereafter, so long as the control signal applied to control terminal 129 remains "high" or at a sufficient positive level, VMOS transistor 47 remains turned on for supplying base current to bipolar transistor 45, maintaining the latter conductive to the edge of saturation, as previously explained. When the control signal is removed or its level decreased to substantially the level of the reference potential, VMOS transistor 47 is turned off rapidly via diode 124, subsequently causing transistor 45 to turn off from its nonsaturated conductive state. Because VMOS 47 turns off much faster than does the bipolar transistor 45, the bipolar device acts as a turn off snubber for VMOS 47. The circuit of FIG. 12 provides very high frequency switching in a range exceeding 100 KHz. Using present state-of-art power transistors for transistor 45, this circuit is capable of switching up to 600 volts at power levels exceeding 60 kilowatts. Note that the differentiating network 133 and integrating network 123 can be eliminated by applying individual control signals from a controller (not shown) to the gates of VMOS transistors 101 and 47, with the amplitudes, phasing, and time durations of these control signals being predetermined for operation of transistors 101 and 47, as previously described.

INDUSTRIAL APPLICABILITY

From the foregoing description of the invention, the present switching device 45,47 is generally applicable for use in relatively high-power switching circuits for providing voltage and current switching functions.

Such switching circuits may be included in converter systems, inverter systems, choppers, and so forth.

What is claimed is:

1. A high-power switching circuit comprising:
    a first vertical metal oxide semiconductor (VMOS) field effect transistor having a gate electrode receptive of a first control signal, a drain electrode and a source electrode;
    a first bipolar power transistor having a collector electrode connected to said drain electrode of the VMOS transistor, and receptive of a first operating voltage, a base electrode connected to said source electrode of said VMOS transistor, and an emitter electrode;
    means receptive to said first control signal and including the characteristics of said VMOS transistor for biasing said bipolar transistor to an operating point within a range up to the edge of saturation; and
    switching transistor means having a control electrode receptive of a second control signal, and a main current path connected between a source of a second operating voltage and the base electrode of said first bipolar transistor switch, said second control signal being applied to the control electrode of said switching transistor means prior to the application of said first control signal to the gate of said first VMOS transistor, said switching transistor means being responsive to said second control signal for substantially lowering the impedance of its main current path for permitting current flow therethrough into the base electrode of and for initiating the turn on of said first bipolar transistor switch, the latter lowering the voltage at its collector as it begins to turn on and reduce the impedance between its collector and emitter electrodes, and substantially immediately thereafter said first control signal being applied to the gate of said first VMOS transistor, for turning the latter on to complete the turn on of said first bipolar transistor switch, after which time said control signal is removed, turning off said switching transistor means, whereby in this manner transient phenomenon is substantially reduced in turning on said first VMOS transistor at a time when said first bipolar switch is partially conducting.

2. The high-power solid-state switching circuit of claim 1, wherein said switching transistor means includes a second vertical metal oxide semiconductor field effect transistor having a drain electrode receptive of said second operating voltage, a source electrode connected to the base electrode of said first bipolar power transistor, and a gate electrode receptive of said second control signal.

3. The switching circuit of claim 1 or claim 2 further including:
    differentiating means responsive to an input signal for producing said second control signal; and
    integrating means responsive to said input signal for producing said first control signal a relatively short period of time after the beginning of, but during the time of occurrence of, said second control signal, the time duration of said first control signal ending substantially at the termination of said input signal.

4. A power switching device capable of being fabricated on a single semiconductor substrate comprising:
    first, second, and third terminals;
    a vertical metal oxide semiconductor (VMOS) field effect transistor having a gate, source, and drain electrodes;
    a bipolar transistor having a base, emitter, and collector electrodes;
    conductive means for electrically connecting said drain to said collector, said source to said base, said gate to said first terminal for receiving a first control signal, said emitter to said second terminal, and the common connection of said drain and collector to said third terminal;
    means responsive to said first control signal and including the operating characteristics of said VMOS transistor for biasing said bipolar transistor within an operating range up to the edge of saturation; and
    a switching transistor having a fourth terminal receptive of a second control signal and a main current path electrically connected to the base of the bipolar transistor, said second control signal being applied to the fourth terminal of said switching transistor prior to the application of said first control signal to the first terminal for initiating the turn on of the bipolar transistor.

* * * * *